United States Patent
Kim et al.

(10) Patent No.: US 8,710,479 B2
(45) Date of Patent: Apr. 29, 2014

(54) SEMICONDUCTOR DEVICES HAVING MULTI-WIDTH ISOLATION LAYER STRUCTURES

(75) Inventors: Dae-Won Kim, Seoul (KR); Yong-Kwan Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/544,484

(22) Filed: Jul. 9, 2012

(65) Prior Publication Data

US 2013/0126814 A1  May 23, 2013

(30) Foreign Application Priority Data

Nov. 22, 2011  (KR) .......................... 10-2011-0121948

(51) Int. Cl.
*H01L 29/02* (2006.01)

(52) U.S. Cl.
USPC ................ 257/2; 257/E21.548; 257/E21.549; 438/423; 438/224; 438/425; 438/228

(58) Field of Classification Search
USPC ......... 438/423, 224, 425, 426, 228, 259, 270, 438/386–392; 257/E21.548, E21.549
See application file for complete search history.

(56) References Cited

U.S. PATENT DOCUMENTS

| 2010/0008163 A1* | 1/2010 | Liu ........................ 365/189.011 |
| 2011/0073944 A1* | 3/2011 | Tsukihara .................... 257/337 |

FOREIGN PATENT DOCUMENTS

| JP | 2910536 B2 | 4/1999 |
| JP | 2009-277774 A | 11/2009 |
| KR | 10-0967201 B1 | 6/2010 |

* cited by examiner

*Primary Examiner* — Mark A Laurenzi
(74) *Attorney, Agent, or Firm* — Myers Bigel Sibley & Sajovec, P.A.

(57) ABSTRACT

According to example embodiments, there is provided a semiconductor device including a substrate and an isolation layer structure. The substrate includes an active region having an upper active pattern and a lower active pattern on the upper active pattern. The active region has a first aspect ratio larger than about 13:1 and a second aspect ratio smaller than about 13:1. The first aspect ratio is defined as a ratio of a sum of heights of the upper active pattern and the lower active pattern with respect to a width of the upper active pattern. The second aspect ratio is defined as a ratio of the sum of the heights of the upper active pattern and the lower active pattern with respect to a width of the lower active pattern. The isolation layer structure is adjacent to the active region.

13 Claims, 11 Drawing Sheets

SEMICONDUCTOR DEVICES HAVING MULTI-WIDTH ISOLATION LAYER STRUCTURES

CROSS-REFERENCE TO RELATED APPLICATION

This application claims priority under 35 USC §119 to Korean Patent Application No. 10-2011-0121948 filed on Nov. 22, 2011 in the Korean Intellectual Property Office (KIPO), the contents of which are herein incorporated by reference in their entirety.

BACKGROUND

1. Field

Example embodiments relate to semiconductor devices including isolation layer structures and methods of manufacturing the same. More particularly, example embodiments relate to semiconductor devices including isolation layer structures having a large aspect ratio and methods of manufacturing the same.

2. Description of the Related Art

In order to electrically isolate semiconductor device memory cells or other devices from each other, a plurality of trenches may be formed at upper portions of a substrate, and the trenches may be filled with an insulating material to form a plurality of isolation layer structures. As a design rule of the semiconductor device decreases, a depth of the isolation layer structures may increase, and a width of the isolation layer structures may decrease. Therefore, an aspect ratio of the trenches for forming the isolation layer structures may increase.

SUMMARY

Example embodiments can provide semiconductor devices including a stable isolation layer structure having a large aspect ratio.

Example embodiments can provide methods of manufacturing semiconductor devices including a stable isolation layer structure having a large aspect ratio.

According to example embodiments, there is provided a semiconductor device including a substrate and an isolation layer structure. The substrate includes an active region having an upper active pattern and a lower active pattern on the upper active pattern. The active region has a first aspect ratio larger than about 13:1 and a second aspect ratio smaller than about 13:1 and smaller than the first aspect ratio. The first aspect ratio is defined as a ratio of a sum of heights of the upper active pattern and the lower active pattern with respect to a width of the upper active pattern. The second aspect ratio is defined as a ratio of the sum of the heights of the upper active pattern and the lower active pattern with respect to a width of the lower active pattern. The isolation layer structure is adjacent to the active region.

In example embodiments, both of a ratio of the height of the upper active pattern with respect to the width of the upper active pattern and a ratio of the height of the lower active pattern with respect to the width of the lower active pattern may be smaller than about 13:1.

In example embodiments, each of the active region and the isolation layer structure may extend in a first direction, and both of a plurality of active regions and a plurality of isolation layer structures may be provided in a second direction substantially perpendicular to the first direction.

In example embodiments, the isolation layer structure may fill a first trench at an upper portion of the substrate and a second trench under the first trench. The second trench may be in fluid communication with the first trench.

In example embodiments, a width of the first trench may be larger than a width of the second trench.

In example embodiments, the isolation layer structure may include a first insulation layer pattern on an inner wall of a first trench, a second insulation layer pattern on the first insulation layer pattern and a third insulation layer pattern on the second insulation layer pattern. The first insulation layer may fill the second trench. The third insulation layer pattern may fill a remaining portion of the first trench.

In example embodiments, the first insulation layer pattern and the third insulation layer pattern may include an oxide and the second insulation layer pattern may include a nitride.

In example embodiments, the semiconductor device may further include a diode on the active region, a lower electrode on the diode, a phase change material layer pattern on the lower electrode and an upper electrode on the phase change material layer pattern.

In example embodiments, the semiconductor device may further include a bit line electrically connected to the upper electrode.

According to example embodiments, there is provided a method of manufacturing a semiconductor device. In the method, an upper portion of a substrate is etched to form a plurality of first trenches, thereby defining an upper active pattern between the first trenches. A portion of the substrate exposed by bottom surfaces of the first trenches is etched to form a plurality of second trenches, thereby defining a lower active pattern between the second trenches. Isolation layer structures are formed in, and in some embodiments to fill, the first and second trenches. Both of aspect ratios of the first and second trenches are smaller than about 13:1. A first aspect ratio of a sum of heights of the upper active pattern and the lower active pattern with respect to a width of the upper active pattern is larger than about 13:1. A second aspect ratio of and the sum of the heights of the upper active pattern and the lower active pattern with respect to a width of the lower active pattern is smaller than about 13:1 and smaller than the first aspect ratio.

In example embodiments, forming the first trenches may include forming a first mask on the substrate and etching the substrate using the first mask as an etching mask.

In example embodiments, after etching the substrate, the first mask may be partially etched to reduce a width of a bottom surface of the first mask such that the width of the bottom surface of the first mask may be substantially the same as or smaller than the width of the upper active pattern.

In example embodiments, forming the second trenches may include forming a second mask layer on the bottom surface and sidewalls of the first trenches, partially removing the second mask layer on the bottom surface of the first trenches to form a second mask on the bottom surface and sidewalls of the first trenches and etching a portion of the substrate exposed by the second mask.

In example embodiments, forming the isolation layer structure may include forming a first insulation layer pattern on inner walls of the first trenches, forming a second insulation layer pattern on the first insulation layer pattern and forming a third insulation layer pattern on the second insulation layer pattern to fill remaining portions of the first trenches. The first insulation layer pattern may fill the second trenches.

In example embodiments, after forming the first trenches and forming the second trenches, a stripping process may be performed using hydrofluoric acid (HF), buffer oxide etchant (BOE) and/or limulus amoebocyte lysate (LOL) solution as an etching solution and a drying process may be performed to remove the etching solution.

Semiconductor devices according to other example embodiments comprise a semiconductor substrate including first and second opposing semiconductor faces and a plurality of trenches therein. A respective trench includes a first semiconductor trench wall that extends into the semiconductor substrate, from the first face to a first depth from the first face. A respective trench further includes a second semiconductor trench wall that extends into the semiconductor substrate, from a second depth that is deeper from the first face than the first depth to a third depth that is deeper from the first face than the second depth. A respective trench still further includes a third semiconductor trench wall that extends into the semiconductor substrate at a lesser slope than that of the first and second semiconductor trench walls, from the first semiconductor trench wall at the first depth to the second semiconductor trench wall at the second depth. A respective trench has a different width from the first face to the first depth compared to from the second depth to the third depth. An isolation region is provided in the trench, on the first, second and third semiconductor trench walls.

In some example embodiments, the first semiconductor trench wall and the second semiconductor trench wall both extend into the semiconductor substrate orthogonal to the first face and the third semiconductor trench wall extends into the semiconductor substrate oblique to the first face. In some example embodiments, a respective trench is wider from the first face to the first depth than from the second depth to the third depth. In some example embodiments, the plurality of trenches define a plurality of active semiconductor regions, a respective one of which extends between adjacent trenches.

In still further example embodiments, the isolation region comprises a first insulation layer that lines the first semiconductor trench walls and fills the trenches between the second semiconductor trench walls, and a second insulation layer on the first insulation layer that fills the trenches between the first semiconductor trench walls. Moreover in still further embodiments, the semiconductor device further comprises a diode on a respective semiconductor active region, a first electrode on a respective diode, a phase change layer on a respective first electrode and a second electrode on a respective phase change layer.

According to example embodiments, a plurality of first trenches may be formed at upper portions of the substrate, and a plurality of second trenches in fluid communication with the first trenches may be formed under the first trenches, thereby forming an upper active pattern and a lower active pattern between the first trenches and the second trenches, respectively. A plurality of isolation structures filling the first and second trenches may be formed. An active region including the upper active pattern and the lower active pattern may have an aspect ratio smaller than that of a conventional active region including a single active pattern, so that the active region may not lean or collapse.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor device having an isolation structure in accordance with example embodiments;

FIGS. 2 to 10 are cross-sectional views illustrating a method of manufacturing a semiconductor device having an isolation structure in accordance with example embodiments;

FIG. 11 is a cross-sectional view illustrating a phase change memory device having an isolation structure in accordance with example embodiments;

FIGS. 12 to 19 are cross-sectional views illustrating a method of manufacturing a phase change memory device having an isolation structure in accordance with example embodiments.

DETAILED DESCRIPTION OF THE EMBODIMENTS

Figure 1:
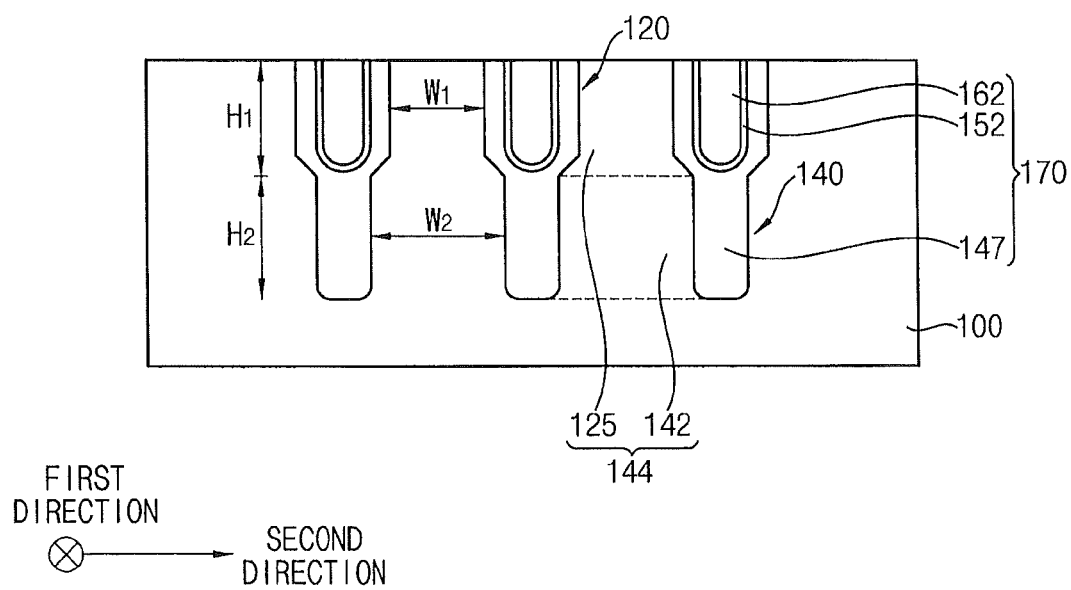
FIGS. 1 to 19 represent non-limiting, example embodiments as described herein.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Various embodiments described herein may arise from recognition that an active region between the trenches having a large aspect ratio may lean or collapse. This leaning or collapsing may become a problem, for example, in a method of manufacturing a memory device including an active region having a linear or bar shape such as a phase change memory device, a magnetic memory device, a resistive memory device, etc. Specifically, an active region between the trenches having an aspect ratio larger than 13:1 may lean or collapse during a strip process using an etching solution and/or a drying process for removing the etching solution.

Various embodiments described herein can provide semiconductor devices including a substrate having an active region. The active region may have an upper active pattern and a lower active pattern. The lower active pattern may have a second width W2 larger than a first width W1 of the upper active pattern. Therefore, the active region may not lean or collapse.

Moreover, various embodiments described herein can provide methods of manufacturing semiconductor devices. In these methods, second trenches between the lower active patterns may be self-aligned with first trenches between the upper active patterns, because a second mask may be formed on inner walls of the first trenches, and the second trenches may be formed by an etching process using the second mask as an etching mask.

Hereinafter, example embodiments will be explained in detail with reference to the accompanying drawings.

FIG. 1 is a cross-sectional view illustrating a semiconductor device having an isolation structure in accordance with example embodiments.

Referring to FIG. 1, the semiconductor device may include a substrate 100 and an isolation layer structure 170. The substrate may comprise a single element and/or compound semiconductor substrate including first and second opposing semiconductor faces.

The isolation layer structure 170 may fill a first trench 120 and a second trench 140 at an upper portion of the substrate 100. In example embodiments, a plurality of first trenches 120 and a plurality of second trenches 140 may be formed in a second direction. An active region 144 may be defined as a portion of substrate 100 between trench structures including the first and second trenches 120 and 140.

The second trench 140 may be in fluid communication with the first trench 120. In example embodiments, each of the first and second trenches 120 and 140 may extend in a first direction substantially perpendicular to the second direction. Accordingly, the isolation layer structure 170 also may extend in the first direction, and a plurality of isolation layer structures 170 may be arranged in the second direction.

The isolation layer structure 170 may have at least one layer including an insulating material. In example embodiments, the isolation layer structure 170 may include a first insulation layer pattern 147, a second insulation layer pattern 152 and a third insulation layer pattern 162.

The first insulation layer pattern 147 may be disposed in the second trench 140 and on an inner wall of the first trench 120. In example embodiments, the first insulation layer pattern 147 may have a uniform thickness on the substrate 100. In an example embodiment, the first insulation layer pattern 147 may sufficiently fill the second trench 140, and may be formed on the inner wall of the first trench 120. Alternatively, the first insulation layer pattern 147 may partially fill the second trench 140, and thus may be disposed on an inner wall of the second trench 140 and on the inner wall of the first trench 120. For example, the first insulation layer pattern 147 may include boro-phospho-silicate glass (BPSG), tonen silazene (TOSZ), undoped silicate glass (USG), spin on glass (SOG), flowable oxide (FOX), tetra-ethyl-ortho-silicate (TEOS) and/or high density plasma chemical vapor deposition (HDP-CVD) oxide, etc.

The second insulation layer pattern 152 may be disposed on the first insulation layer pattern 147. In example embodiments, the second insulation layer pattern 152 may have a uniform thickness on the first insulation layer pattern 147. For example, the second insulation layer pattern 152 may include silicon nitride and/or silicon oxynitride. The second insulation layer pattern 152 may reduce a leakage current.

The third insulation layer pattern 165 may be disposed on the second insulation layer pattern 152 to fill remaining portions of the first trench 120 and/or the second trench 140. For example, the third insulation layer pattern 165 may include BPSG, TOSZ, USG, SOG, FOX, TEOS and/or HDP-CVD oxide, etc. Alternatively, the third insulation layer pattern 165 may include middle temperature oxide (MTO).

The active region 144 may include an upper active pattern 125 and a lower active pattern 142. A portion of the substrate 100 between the first trenches 120 may be defined as the upper active pattern 125, and a portion of the substrate 100 between the second trenches 140 may be defined as the lower active pattern 142.

In example embodiments, the active region 144 including the upper active pattern 125 and the lower active pattern 142 may extend in the first direction. A plurality of active regions 144 may be arranged in the second direction.

The upper active pattern 125 may have a first width W1 and a first height H1, and the lower active pattern 142 may have a second width W2 and a second height H2. In example embodiments, the upper active pattern 125 may be disposed on the lower active pattern 142, and the first width W1 of the upper active pattern 125 may be smaller than the second width W2 of the lower active pattern 142.

In example embodiments, sidewalls of the upper active pattern 125 and the lower active pattern 142 may be substantially perpendicular (orthogonal) to a top surface of the substrate 100. That is, the first width W1 of the upper active pattern 125 may not vary in a direction substantially perpendicular to the top surface of the substrate 100, and the second width W2 of the lower active pattern 142 may not vary in the direction substantially perpendicular to the top surface of the substrate 100. Alternatively, the sidewall of the upper active pattern 125 may have an angle with respect to the top surface of the substrate 100. That is, the first width W1 of the upper active pattern 125 may decrease from a bottom to a top of the upper active pattern 125.

In example embodiments, an aspect ratio of the upper active pattern 125, which may be a ratio of the first height H1 with respect to the first width W1, and an aspect ratio of the lower active pattern 142, which may be a ratio of the second height H2 with respect to the second width W2, may be both smaller than about 13:1.

A first aspect ratio of the active region 144, which may be defined as a ratio of a sum of the first height H1 of the upper active pattern 125 and the second height H2 of the lower active pattern 142 with respect to the first width W1 of the upper active pattern 125, may be larger than about 13:1. However, a second aspect ratio of the active region 144, which may be defined as a ratio of a sum of the first height H1 and the second height H2 with respect to the second width W2, may be smaller than about 13:1 and smaller than the first aspect ratio. Accordingly, the active region 144 may not lean or collapse during a formation of the isolation layer structure 170. The isolation layer structure 170 may have a relatively large aspect ratio, so that the semiconductor device having the isolation layer structure 170 may have an improved electrical characteristic.

FIGS. 2 to 10 are cross-sectional views illustrating a method of manufacturing a semiconductor device having an isolation structure in accordance with example embodiments.

Figure 2:
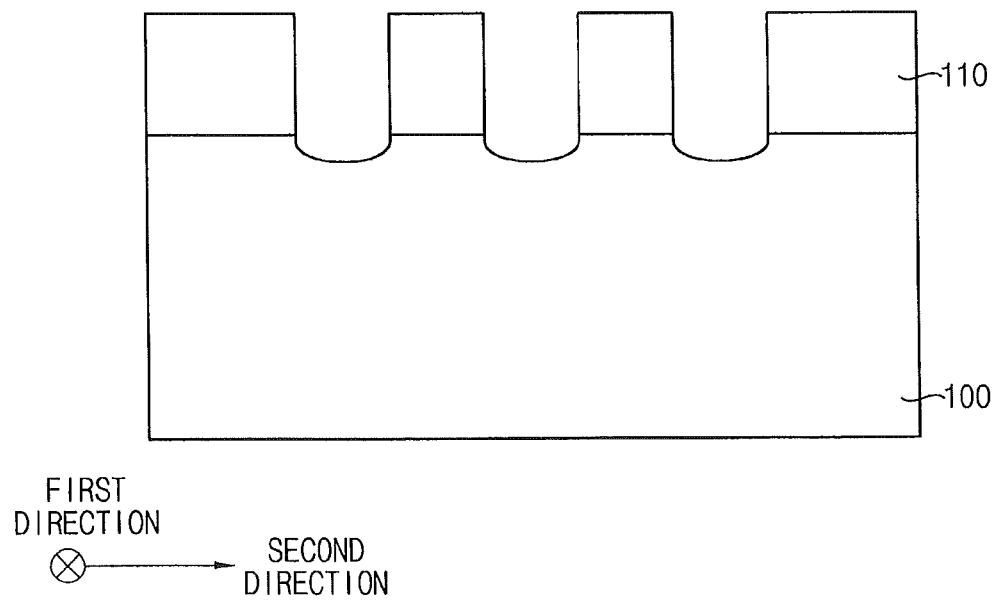

Referring to FIG. 2, a first mask 110 may be formed on a substrate 100.

The substrate 100 may include a semiconductor substrate such as a silicon substrate, a germanium substrate or a silicon-germanium substrate, a substrate having a semiconductor layer and an insulation layer such as a silicon-on-insulator (SOI) substrate or a germanium-on-insulator (GOI) substrate, or a single crystalline metal oxide substrate.

In example embodiments, a mask layer may be formed on the substrate 100 using, for example, a nitride such as silicon nitride, and the mask layer may be patterned by a photolithography process to form the first mask 110. That is, a photoresist pattern (not shown) may be formed on the substrate 100 having the mask layer thereon, and the mask layer may be etched using the photoresist pattern as an etching mask to form the first mask 110. An ashing process and/or a stripping process may be further performed to remove the photoresist pattern.

In example embodiments, the first mask 110 may extend in a first direction, and a plurality of first masks 110 may be disposed in a second direction substantially perpendicular to the first direction.

Figure 3:
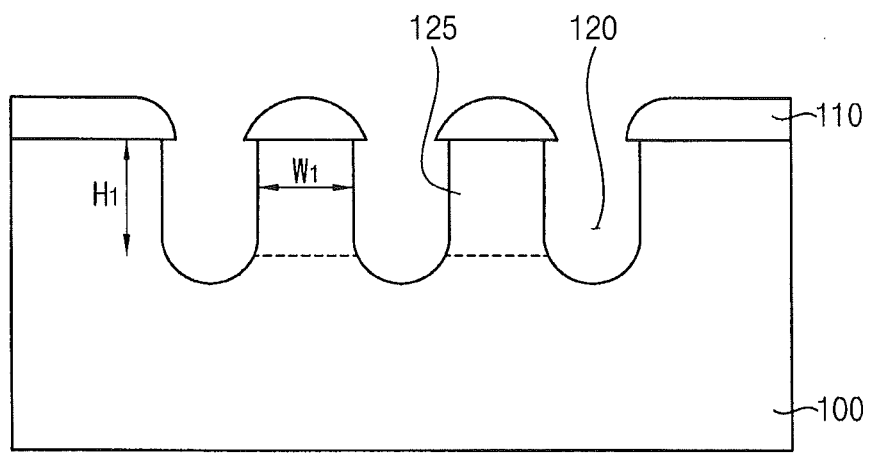

Referring to FIG. 3, an upper portion of the substrate 100 may be etched using the first mask 110 as the etching mask to form the first trench 120.

In example embodiments, the first trench 120 may extend in the first direction, and a plurality of first trenches 120 may be disposed in the second direction. An upper portion of the substrate 100 between the first trenches 120 may be defined as an upper active pattern 125.

In example embodiments, the first trench 120 may be formed by a dry etching process and/or a wet etching process. The substrate 100 may have a higher etch rate than that of the first mask 110, so that a width of a bottom surface of the first mask 110 may be larger than a first width W1 of the upper active pattern 125.

In example embodiments, an aspect ratio of the upper active pattern 125, which may be a ratio of a first height H1 of the upper active pattern 125 with respect to the first width W1, may be smaller than about 13:1. According to experimental results, if the aspect ratio of the active pattern is larger than about 13:1, the active pattern may lean or collapse. However, the upper active pattern 125 may have the aspect ratio below about 13:1, so that the upper active pattern 125 may not lean or collapse.

In example embodiments, a sidewall of the first trench 120 or a sidewall of the upper active pattern 125 may be substantially perpendicular to a top surface of the substrate 100. That is, the first width W1 of the upper active pattern 125 may not vary in a direction perpendicular to the top surface of the substrate 100. Alternatively, the sidewall of the upper active pattern 125 may have an angle with respect to the top surface of the substrate 100. That is, the first width W1 of the upper active pattern 125 may decrease from a bottom to a top of the upper active pattern 125.

Figure 4:
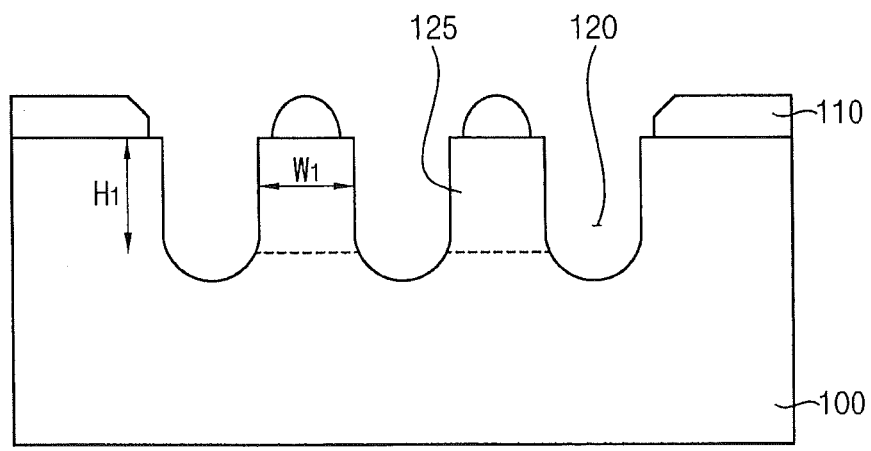

Referring to FIG. 4, a stripping process may be performed on the substrate 100 having the first mask 110 thereon.

In example embodiments, the stripping process may include a wet etching process using hydrofluoric acid (HF), buffer oxide etchant (BOE) and/or limulus amoebocyte lysate (LOL) solution as an etching solution. The etching solution may have an etch selectivity between the substrate 100 and the first mask 110. That is, the etching solution may have an etch rate for the first mask 110 higher than for the substrate 100, so that the width of the bottom surface of the first mask 110 may decrease. Therefore, the width of bottom surface of the first mask 110 may be substantially the same as or smaller than the first width W1 of the upper active pattern 125.

In example embodiments, a drying process may be further performed to remove the etching solution used in the strip process. A capillary force may be generated at the upper active pattern 125 depending on a difference in the remaining etching solution. However, an aspect ratio of the upper active pattern 125 may be smaller than about 13:1, so that the upper active pattern 125 may not lean or collapse due to the capillary force.

Figure 5:
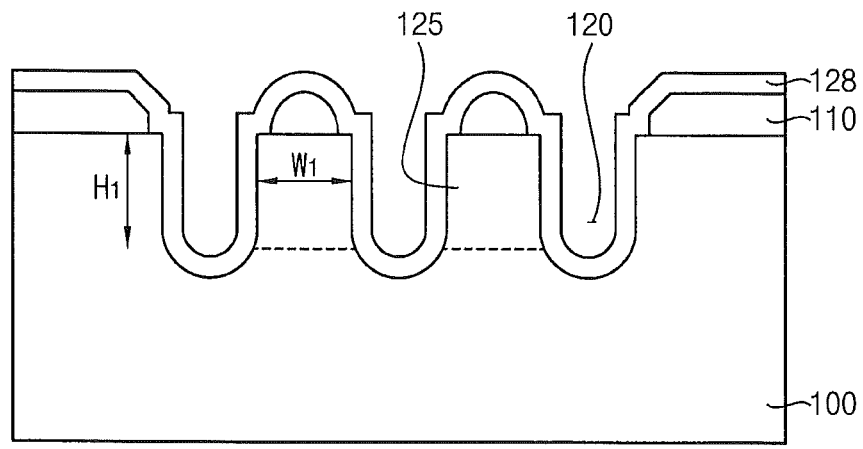

Referring to FIG. 5, a second mask layer 128 may be formed on the first mask 110, the substrate 100, and an inner wall of the first trench 120.

For example, the second mask layer 128 may be formed using USG, SOG, BPSG, TOSZ, FOX, TEOS, PE-TEOS and/or HDP-CVD. In example embodiments, the second mask layer 128 may be formed by a chemical vapor deposition (CVD) process, a sputtering process, an atomic layer deposition (ALD) process and/or a plasma enhanced CVD (PECVD) process. In example embodiments, the second mask layer 128 may have a uniform thickness on the first trench 120 and the first mask 110.

Figure 6:
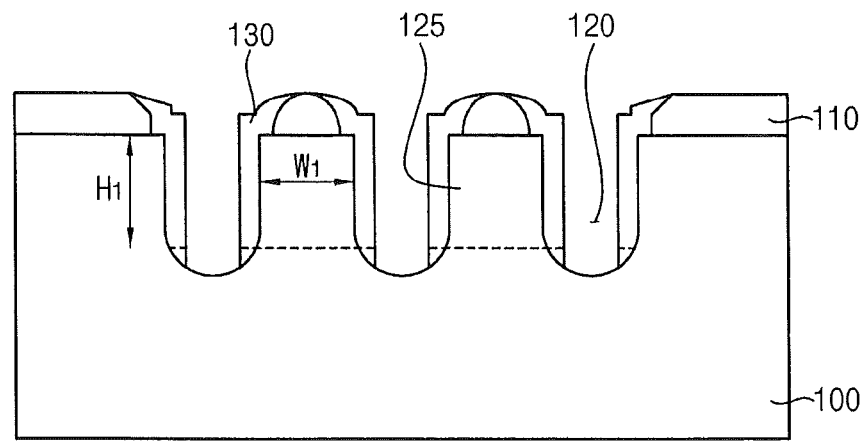

Referring to FIG. 6, the second mask layer 128 may be partially removed to form a second mask 130.

In example embodiments, an etch back process may be performed to partially remove the second mask layer 128 disposed on a bottom surface of the first trench 120 and a top surface of the first mask 110. Therefore, portions of the second mask layer 128 disposed on sidewalls of the first trench 120 and the first mask 110 may remain to form a second mask 130. A portion of the bottom surface of the first trench 120 may not covered by the second mask 130.

Figure 7:
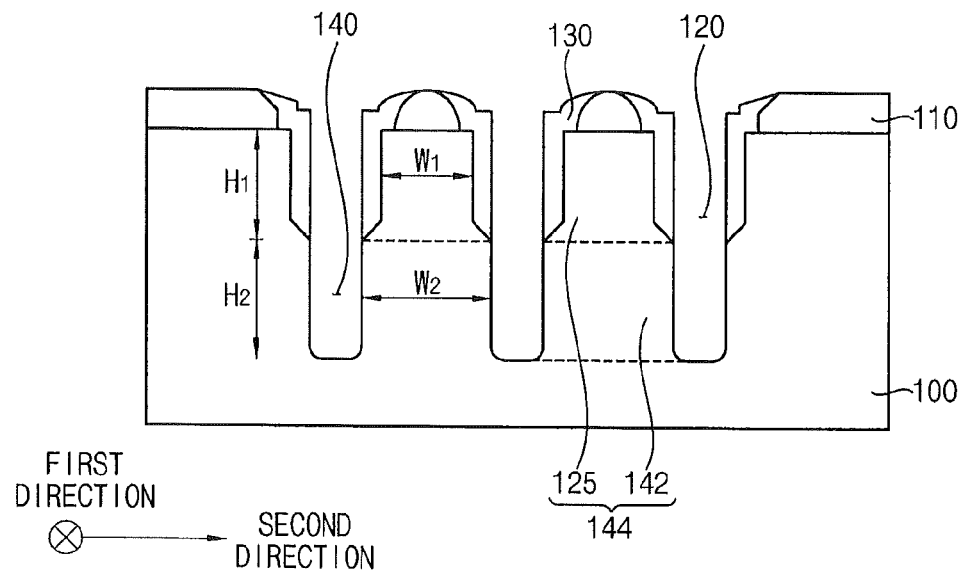

Referring to FIG. 7, the substrate 100 may be etched by using the second mask 130 as an etching mask to form a second trench 140.

In example embodiments, the second trench 140 may be formed by a dry etching process and/or a wet etching process. In the etching process, the second mask 130 disposed on sidewall of the first trench 120 may be used as the etching mask, so that the second trench 140 may be formed to be in fluid communication with the first trench 120. That is, the second trench 140 may be self-aligned with the first trench 120.

In example embodiments, the sidewall of the second trench 140 may be substantially perpendicular to the top surface of the substrate 100. That is, a width of the second trench 140 may be constant in a direction substantially perpendicular to the surface of the substrate 100.

The width of the second trench 140 may be smaller than a width of the first trench 120 by a thickness of the second mask 130. In example embodiments, the first trench 120 may extend in the first direction, and a plurality of second trenches 140 may be formed in the second direction.

A portion of the substrate 100 between the second trenches 140 may be defined as a lower active pattern 142. In example embodiments, an aspect ratio of the lower active pattern 142, which may be a ratio of a second height H2 with respect to a second width W2 of the lower active pattern 142, may be smaller than about 13:1.

The upper active pattern 125 and the lower active pattern 142 may form an active region 144. In example embodiments, the active region 144 may extend in the first direction, and a plurality of active regions 144 may be formed in the second direction.

In example embodiments, a first aspect ratio of the active region 144, which may be a ratio of a sum of the first height H1 of the upper active pattern 125 and the second height H2 of the lower active pattern 142 with respect to the first width W1 of the upper active pattern 125, may be larger than about 13:1. However, a second aspect ratio of the active region 144, which may be a ratio of a sum of the first height H1 of the upper active pattern 125 and the second height H2 of the lower active pattern 142 with respect to the second width W2 of the lower active pattern 142, may be smaller than about 13:1 and smaller than the first aspect ratio. Therefore, the active region 144 may not lean or collapse.

If an active region includes only a single active pattern having a relatively large height, the active region may lean or collapse. However, the active region 144 may include the upper active pattern 125 and the lower active pattern 142 having the relatively large width than that of the upper active pattern 125, and thus the active region 144 having a relatively large height may not lean or collapse.

Figure 8:
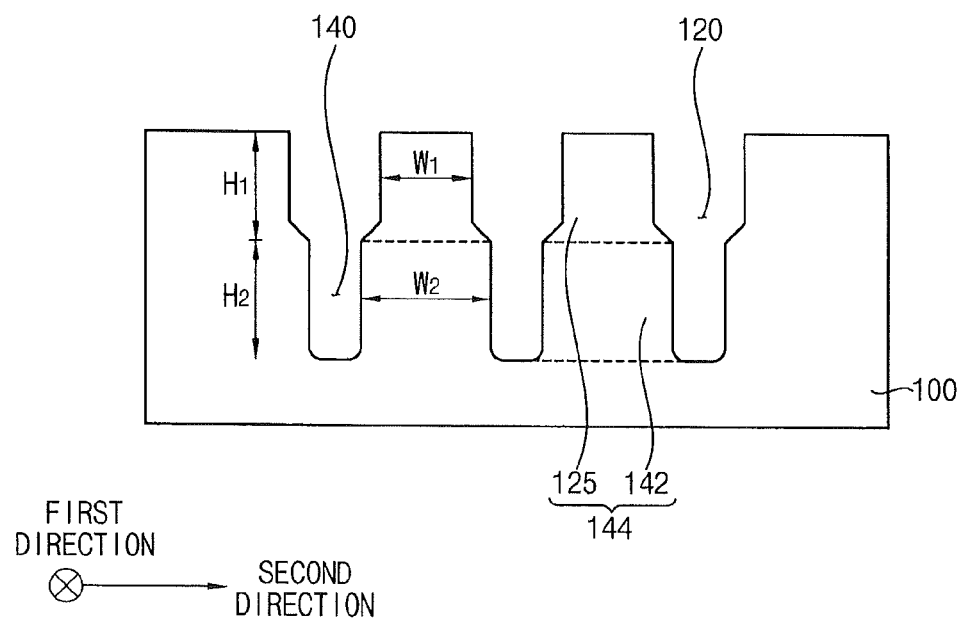

Referring to FIG. 8, the second mask 130 and the first mask 110 may be removed.

In example embodiments, the second mask 130 and the first mask 110 may be removed by a stripping process. In an example embodiment, the stripping process may include a wet etching process using hydrofluoric acid (HF), buffer oxide etchant (BOE) or limulus amoebocyte lysate (LOL) solution as an etching solution.

A drying process for removing the etching solution may be further performed. A capillary force may be generated at the active region 144 depending on a difference in the remaining etching solution. The active region 144 may have the second aspect ratio which may be smaller than about 13:1, so that the active region 144 may not lean or collapse due to the capillary force.

Figure 9:
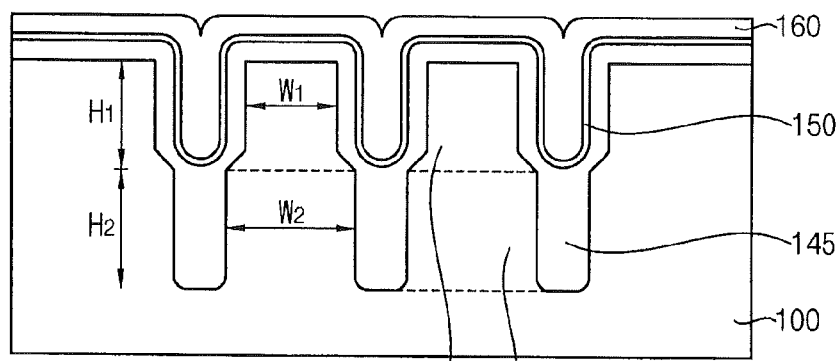

Referring to FIG. 9, first to third insulation layers 145, 150 and 160 may be sequentially formed on the substrate 100 and the inner walls of the first and second trenches 120 and 140.

In example embodiments, the first insulation layer 145 may be formed by a thermal oxidation process. Therefore, an etching damage of the substrate 100 caused by the formation of the first and second trenches 120 and 140 may be cured. In an example embodiment, the first insulation layer 145 may sufficiently fill the second trench 140, and may be formed on the inner wall of the first trench 120. Alternatively, the first insulation layer 145 may partially fill the second trench 140, and thus may be formed on the inner walls of the first and second trenches 120 and 140.

In example embodiments, the second insulation layer 150 may be conformally formed on the first insulation layer 145 using a nitride. For example, the second insulation layer may be formed by a CVD process, a sputtering process, an ALD process or a PECVD process. The second insulation layer 150 may reduce a leakage current.

The third insulation layer 160 may be formed on the second insulation layer 150 to sufficiently fill remaining portions of the first trench 120 and/or the second trench 140. In example embodiments, the third insulation layer 160 may be formed by a CVD process, a sputtering process, an ALD process and/or a PECVD process. For example, the third insulation layer 160 may be formed using BPSG, TOSZ, USG, SOG, FOX, TEOS and/or HDP-CVD oxide, etc. Alternatively, the third insulation layer 160 may be formed using MTO.

Figure 10:
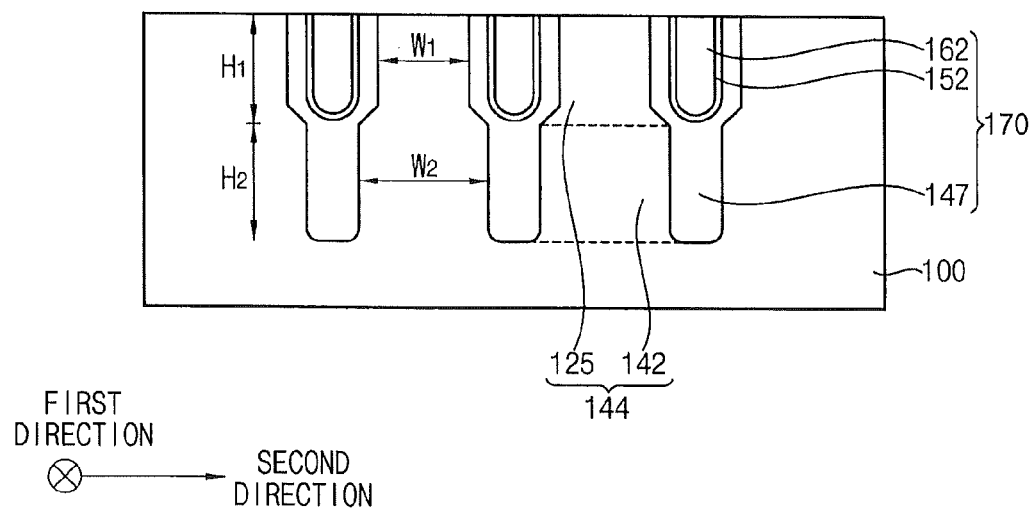

Referring to FIG. 10, upper portions of the first to third insulation layers 140, 150 and 160 may be planarized to form first to third insulation layer patterns 147, 152 and 162, respectively. Therefore, an isolation layer structure 170 may be formed to include the first to third insulation layer patterns 147, 152 and 162. In example embodiments, the planarization process may be performed by a chemical mechanical polishing (CMP) process.

By above mentioned processes, the semiconductor device including an isolation layer structure 170 and the active region 144 disposed between the isolation layer structures 170 may be obtained.

Figure 11:
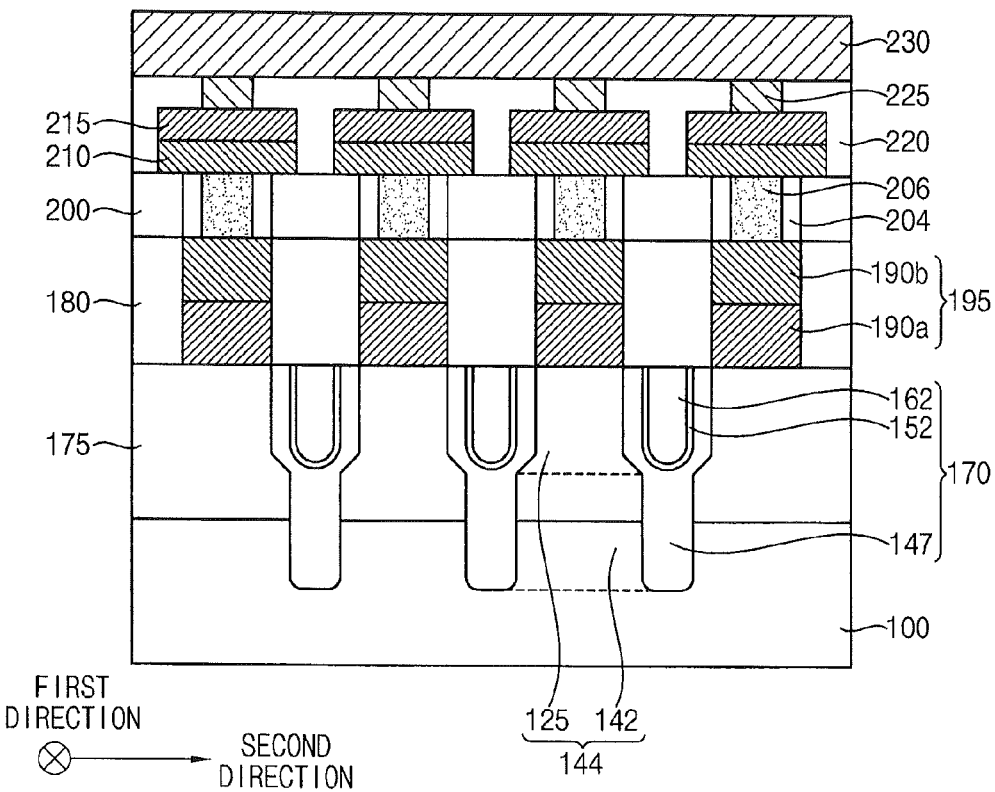

FIG. 11 is a cross-sectional view illustrating a phase change memory device having an isolation structure in accordance with example embodiments.

Referring to FIG. 11, the phase change memory device may include a diode 195, a lower electrode 206, a phase change material layer pattern 210 and an upper electrode 215, which may be formed on an isolation layer structure 170 and an active region 144 illustrated with reference to FIG. 1. The phase change memory device may further include a bit line 230 electrically connected to the upper electrode 215. In example embodiments, the isolation layer structure 170 may include first to third insulation layer patterns 147, 152 and 162, and the active region 144 may include an upper active pattern 125 and a lower active pattern 142.

An impurity region 175 may be disposed at the upper active pattern 125 and a portion of the lower active pattern 142 of the substrate 100. The impurity region 175 may serve as a word line of the phase change memory device. In example embodiments, the impurity region 175 may extend in a first direction, and a plurality of impurity regions 175 may be disposed in a second direction substantially perpendicular to the first direction.

The diode 195 electrically connected to the impurity region 175 may be disposed through the first insulating interlayer 180 on the isolation structure 170 and the substrate 100.

The diode 195 may include a first conductive pattern 190*a* and a second conductive pattern 190*b* sequentially stacked on the impurity region 175. In example embodiments, the first conductive pattern 190*a* may include n-type impurities, and the second conductive pattern 190*b* may include p-type impurities.

In an example embodiment, an ohmic pattern (not shown) including a metal silicide may be further disposed on the second conductive pattern 190*b*.

The lower electrode 206 electrically connected to the second conductive pattern 190*b* may be disposed through a second insulating interlayer 200 on the first insulating interlayer 180 and the diode 195. A spacer 204 may be further disposed to surround a sidewall of the lower electrode 206. In example embodiments, a sum of bottom surfaces of the lower electrode 206 and the spacer 204 may substantially the same as that of a top surface of the diode 195.

In example embodiments, the spacer 204 may include silicon nitride. The lower electrode 206 may include a metal nitride or a metal silicon nitride, e.g., titanium nitride, titanium silicon nitride, tungsten nitride, tungsten silicon nitride, tantalum nitride, tantalum silicon nitride, zirconium nitride and/or zirconium silicon nitride.

The lower electrode 206 may serve as a heater to transform a current into a joule heat. The lower electrode 206 may contact a phase change material layer pattern 201 at a relatively small area due to the spacer 204, so that the phase change memory device may have a relatively high heating efficiency.

The phase change material layer pattern 210 may be disposed on the lower electrode 206, the spacer 204 and the second insulating interlayer 200, and the upper electrode 215 may be disposed on the phase change material layer pattern 210.

The phase change material layer pattern 210 may include a phase change material that may cause a phase change by the heat transferred from the lower electrode 206. The phase change material layer pattern 210 may include a chalcogenide compound or a chalcogenide compound doped with carbon and at least one of nitrogen and metal. The chalcogenide compound may include GeSbSe, SbSe, GeSbTe, SbTe, GeSb, AsSbTe, SnSbTe and/or SnInSbTe, etc. The upper electrode 215 may include a doped polysilicon, a metal, a metal nitride and/or a metal silicide, etc.

A third insulating interlayer 220 may be disposed on the second insulating interlayer 200 to cover the upper electrode 215 and the phase change material layer pattern 210. An upper electrode contact 225 may contact the upper electrode 215 through the third insulating interlayer 220. A bit line 230 may be disposed on the upper electrode contact 225 to be electrically connected to the upper electrode 215. In example embodiments, the bit line 230 may extend in the second direction.

The phase change memory device may include the active region 144 having a stable structure, so that the diode 190, the lower electrode 206, the phase change material layer pattern 210 and the upper electrode 215 also may also have stable structures.

FIGS. 12 to 19 are cross-sectional views illustrating a method of manufacturing a phase change memory device having an isolation structure in accordance with example embodiments.

The method of manufacturing the isolation structure may be substantially the same as or similar to the method of manufacturing the isolation structure illustrated with reference to FIGS. 2 to 10, and thus a detailed description thereabout may be omitted herein.

Figure 12:
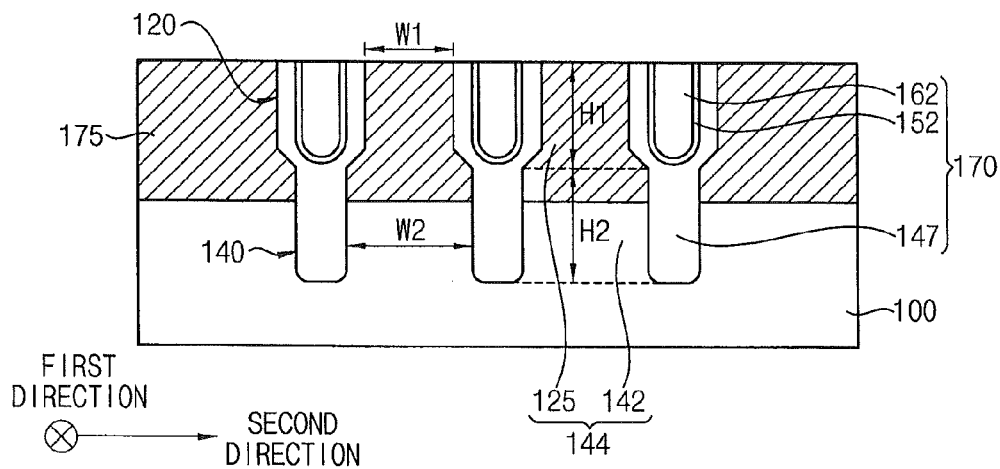

Referring to FIG. 12, a first mask may be formed on a substrate 100, and upper portions of the substrate 100 may be etched by using the first mask as an etching mask to form a plurality of first trenches 120. An upper portion of the substrate 100 between the first trenches 120 may be defined as an upper active pattern 125. A stripping process may be performed on the substrate 100 having the first mask thereon.

A second mask layer may be formed on the first mask 110, the substrate 100 and an inner wall of the first trench 120, and the second mask layer may be partially removed to form a second mask. The substrate 100 may be etched using the second mask as an etching mask to form a plurality of second trenches 140 in fluid communication with the first trenches 120. A portion of the substrate 100 between the second trenches 140 may be defined as a lower active pattern 142. The first mask and the second mask may be removed by a stripping process.

In example embodiments, aspect ratios of the upper and lower active patterns 125 and 142 may be both smaller than about 13:1. An active region 144 may be defined to include the upper active pattern 125 and the lower active pattern 142.

In example embodiments, a first aspect ratio of the active region 144, which may be defined as a ratio of a sum of the first height H1 of the upper active pattern 125 and the second height H2 of the lower active pattern 142 with respect to the first width W1 of the upper active pattern 125, may be larger than about 13:1. However, a second aspect ratio of the active region 144, which may be defined as a ratio of a sum of the first height H1 of the upper active pattern 125 and the second height H2 of the lower active pattern 142 with respect to the second width W2 of lower active pattern 142, may be smaller than about 13:1 and smaller than the first aspect ratio. Accordingly, the active region 144 may not lean or collapse.

First to third insulation layers may be sequentially formed on the substrate 100 and inner walls of the first and second trenches 120 and 140. Upper portions of the first to third insulation layers may be planarized to form first to third insulation layer patterns 147, 152 and 162 filling the first and second trenches 120 and 140. Therefore, an isolation layer structure 170 including the first to third insulation layer patterns 147, 152 and 162 may be formed.

An impurity region 175 may be formed at an upper portion of the substrate 100 by an ion implantation process.

In example embodiments, a plurality of impurity regions 175 may be formed in the second direction, and the impurity regions 175 may extend in the first direction to serve as word lines of the phase change memory device.

In example embodiments, a bottom surface of the impurity region 175 may be lower than a bottom surface of the first trench 120. Alternatively, the bottom surface of the impurity region 175 may be coplanar with the bottom surface of the first trench 120. The active region 144 in accordance with example embodiments may include the upper active pattern 125 and the lower active pattern 142. A second width W2 of the lower active pattern 142 may be relatively large, so that the impurity region 175 may have a relatively low resistance. Therefore, the bottom surface of the impurity region 175 in accordance with example embodiments may be higher than a bottom surface of an impurity region in a conventional phase change memory device.

Figure 13:
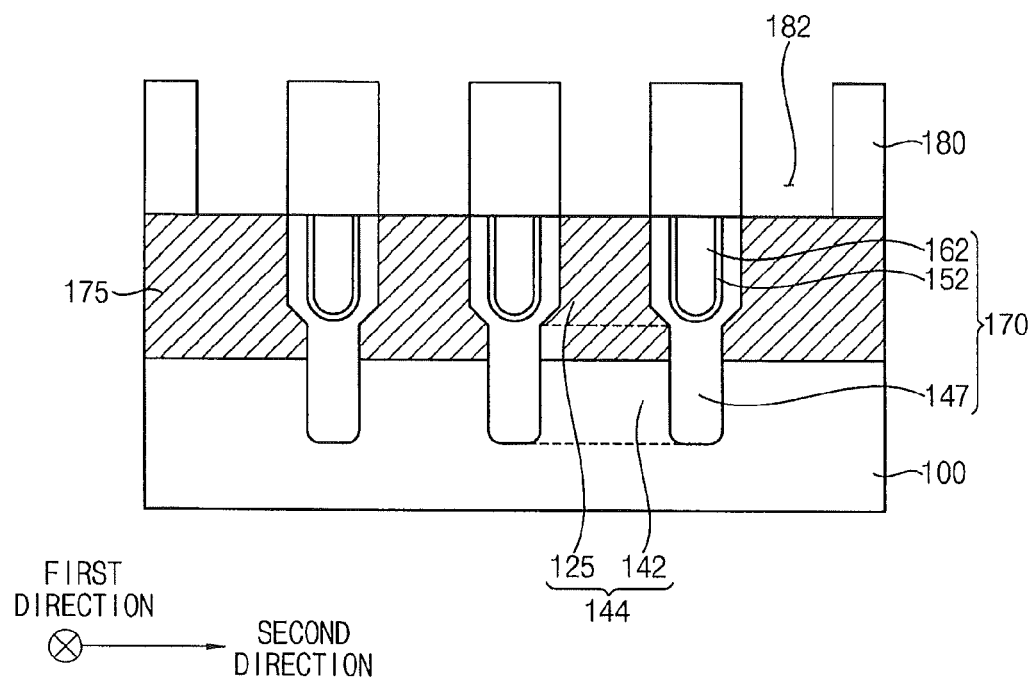

Referring to FIG. 13, a first insulating interlayer 180 may be formed on the impurity region 175 and the isolation layer structure 170, and an opening 182 may be formed through the first insulating interlayer 180 to expose the impurity region 175.

In example embodiments, the first insulating interlayer 180 may be formed using silicon oxide, silicon nitride and/or silicon oxy-nitride, etc., by a CVD process, a PECVD process, a spin coating process and/or a HDP-CVD process, etc.

Figure 14:
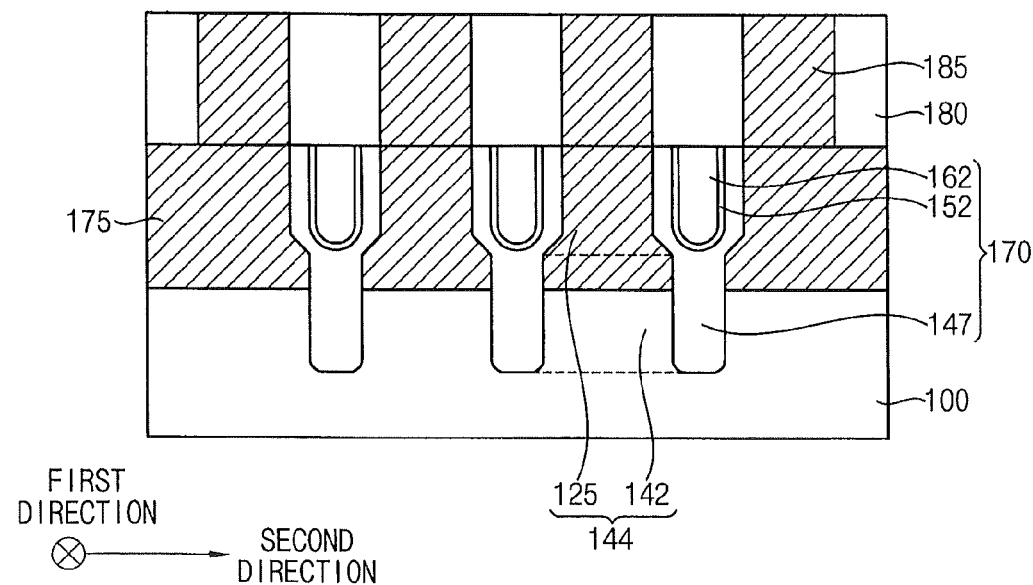

Referring to FIG. 14, a conductive layer pattern 185 may be formed on the impurity region 175 to fill the opening 182.

In example embodiments, a selective epitaxial growth (SEG) process using the impurity region 175 as a seed may be performed to form a conductive layer filling the opening 182, and an upper portion of the conductive layer may be planarized to form the conductive layer pattern 185.

Figure 15:
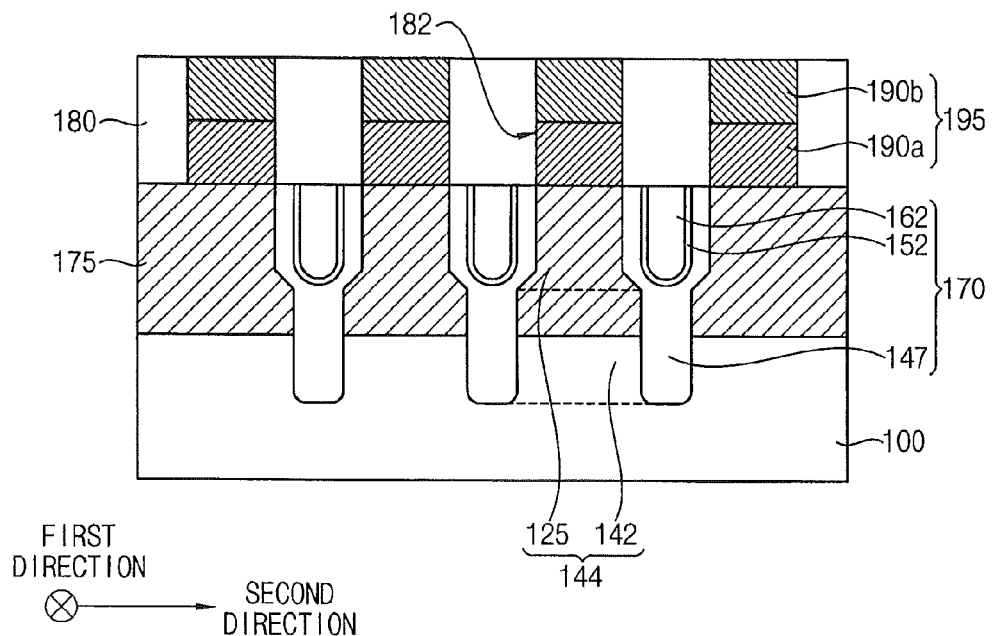

Referring to FIG. 15, impurities may be implanted into the conductive layer pattern 185 to form a first conductive pattern 190a and a second conductive pattern 190b sequentially stacked on the impurity region 175.

The first conductive pattern 190a and the second conductive pattern 190b may be formed to include impurities different from each other. In example embodiments, n-type impurities may be implanted into a lower portion of the conductive layer pattern 185 to form the first conductive pattern 190a doped with the n-type impurities, and then p-type impurities may be implanted into an upper portion of the conductive layer pattern 185 to form the second conductive pattern 190b doped with the p-type impurities. Therefore, a diode 195 including the first and second conductive patterns 190a and 190b may be formed in the opening 182.

In an example embodiment, a silicidation process may be performed on the diode 195 to further form an ohmic pattern (not shown) including a metal silicide on the diode 195.

Figure 16:
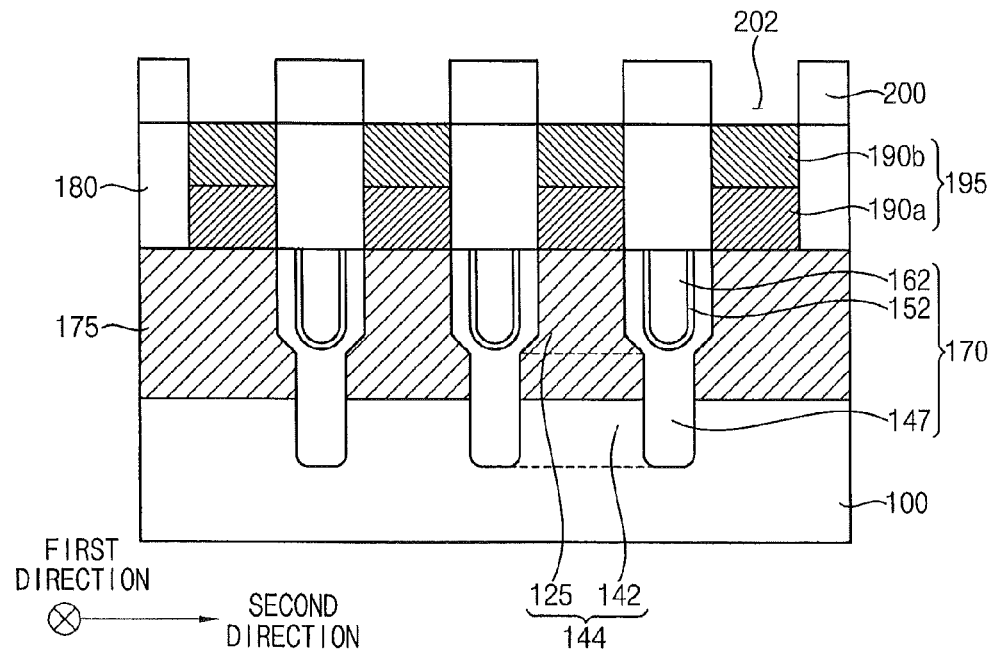

Referring to FIG. 16, a second insulating interlayer 200 may be formed on the first insulating interlayer 180 and the diode 195, and a first contact hole 202 may be formed through the second insulating interlayer 200 to expose the diode 195.

The second insulating interlayer 200 may be formed using silicon oxide, silicon nitride and/or silicon oxy-nitride by a CVD process, a PECVD process, a spin coating process and/or a HDP-CVD process, etc.

Figure 17:
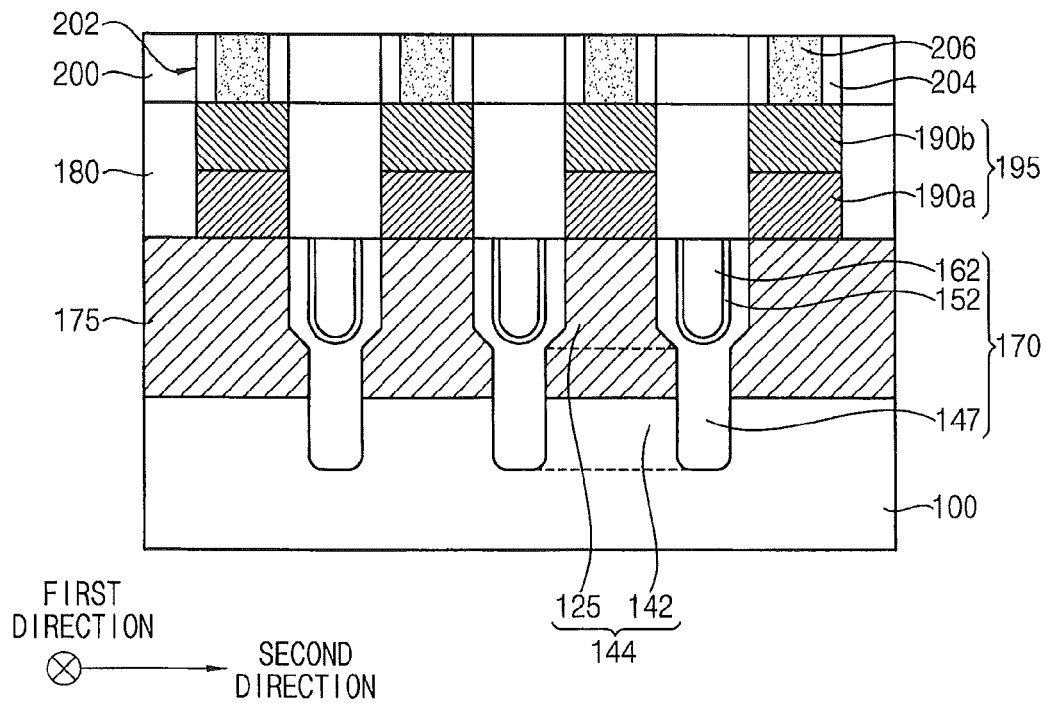

Referring to FIG. 17, a spacer 204 may be formed on a sidewall of the first contact hole 202, and a lower electrode 206 may be formed on the second conductive pattern 190b to fill a remaining portion of the first contact hole 202.

In example embodiments, a spacer layer including silicon nitride may be formed on the second insulating interlayer 200, an inner wall of the first contact hole 202, and the second conductive pattern 190b, and then the spacer layer may be partially removed by an etch back process or an anisotropical etching process to form the spacer 204. A contact area between the lower electrode 206 and the phase change material layer pattern 210 may decrease due to the spacer 204, so that a heating efficiency of the phase change material layer pattern 210 may increase.

A lower electrode layer may be formed on the second conductive pattern 190b to fill a remaining portion of the first contact hole 202, and an upper portion of the lower electrode layer may be planarized by a CMP process and/or an etch back process until a top surface of the second insulating interlayer 200 is exposed, thereby forming the lower electrode 206.

The lower electrode layer may be formed using a metal nitride or a metal silicon nitride, e.g., titanium nitride, titanium silicon nitride, tungsten nitride, tungsten silicon nitride, tantalum nitride, tantalum silicon nitride, zirconium nitride and/or zirconium silicon nitride by an ALD process, a PVD process and/or a sputtering process, etc.

Figure 18:
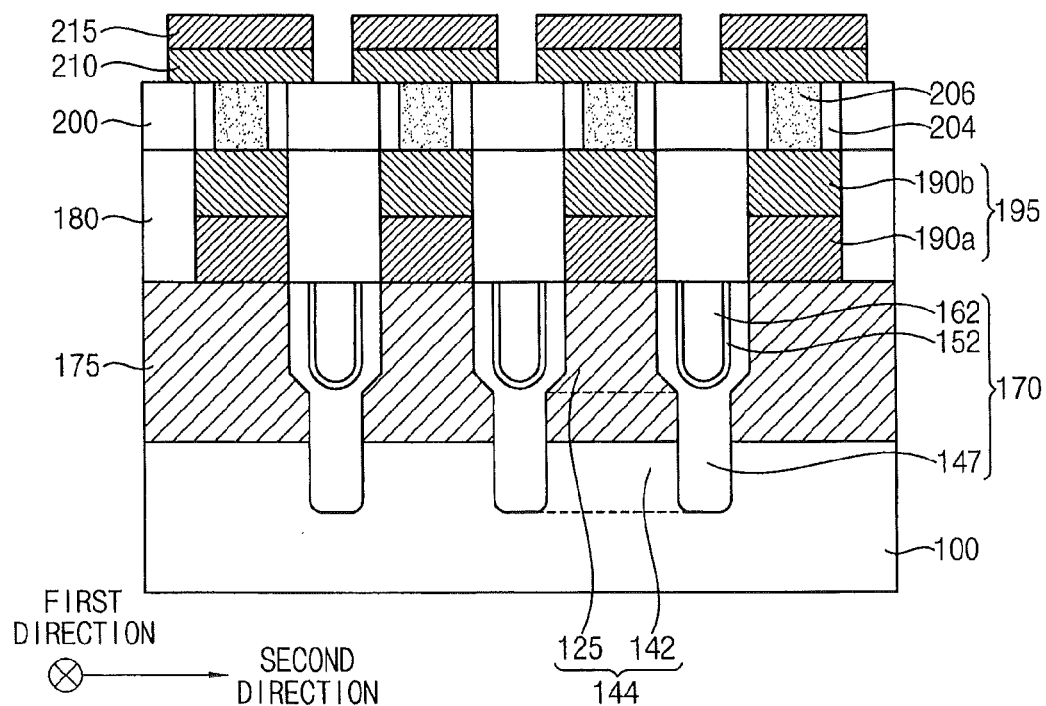

Referring to FIG. 18, a phase change material layer pattern 210 and an upper electrode 215 may be formed on the lower electrode 206, the spacer 204 and the second insulating interlayer 200.

In example embodiments, a phase change material layer and an upper electrode layer may be sequentially formed on the lower electrode 206, the spacer 204 and the second insulating interlayer 200, and the phase change material layer and the upper electrode layer may be patterned to form the upper electrode 215 and the phase change material layer pattern 210, respectively.

In example embodiments, the phase change material layer may be formed using a chalcogenide compound and/or a chalcogenide compound doped with carbon and nitrogen and/or metal by a PVD process and/or a sputtering process. For example, the chalcogenide compound may include GeSbSe, SbSe, GeSbTe, SbTe, GeSb, AsSbTe, SnSbTe and/or SnInSbTe, etc. The upper electrode layer may be formed using doped polysilicon, a metal, a metal nitride and/or a metal silicide, etc. by a CVD process, an ALD process and/or a sputtering process, etc.

Figure 19:
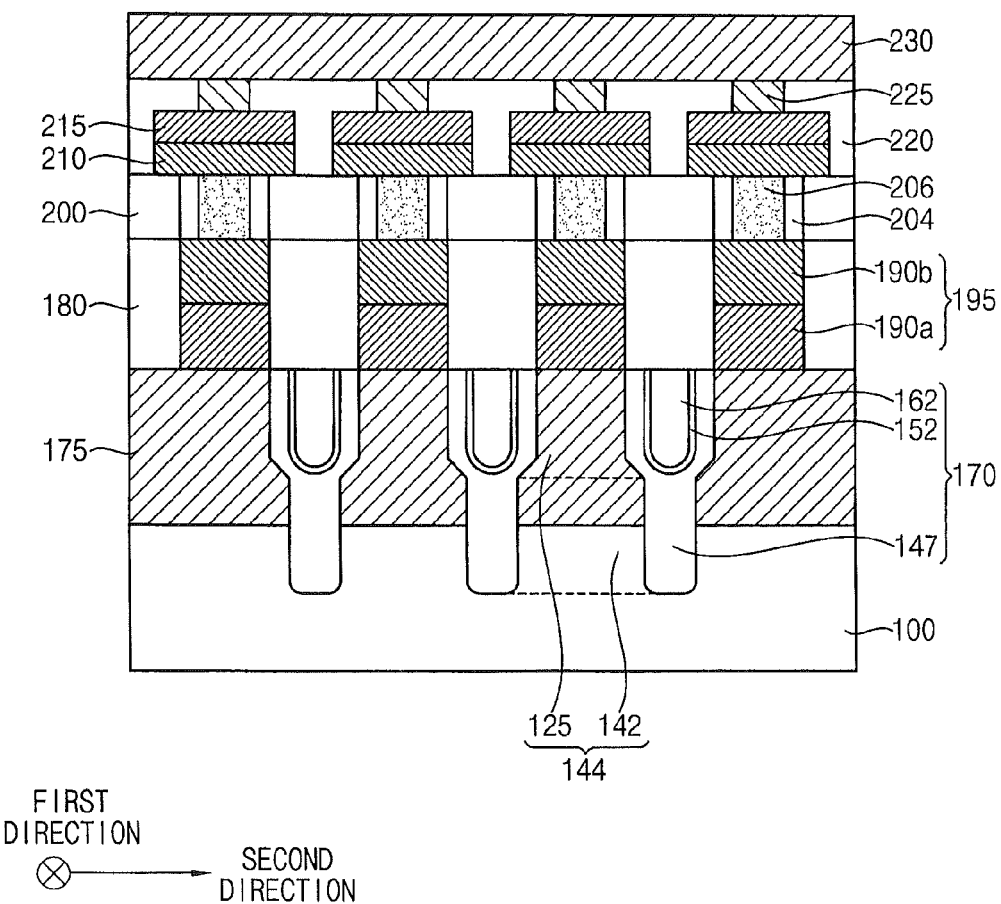

Referring to FIG. 19, an upper electrode contact 225 contacting the upper electrode 215 and a bit line 230 electrically connected to the upper electrode 215 may be formed.

In example embodiments, a third insulating interlayer 220 including silicon oxide may be formed on the second insulating interlayer 200 to cover the phase change material layer pattern 210 and the upper electrode 215, and the third insulating interlayer 220 may be partially etched to form a second contact hole partially exposing the upper electrode 215. A conductive layer may be formed on the third insulating interlayer 220 and the upper electrode 215 to fill the second contact hole, and an upper portion of the conductive layer may be planarized to form the upper electrode contact 225.

The bit line 230 including a metal, doped polysilicon may be formed on the third insulating interlayer 220 and the upper electrode contact 225. In example embodiments, the bit line 230 may extend in the second direction.

By above mentioned processes, the phase change memory device including the isolation layer structure 170 may be manufactured. According to example embodiments, the active region 144 between the isolation layer structures 170 may have a stable structure, so that the phase change memory device may also have a stable structure and desired properties.

Figure 20:
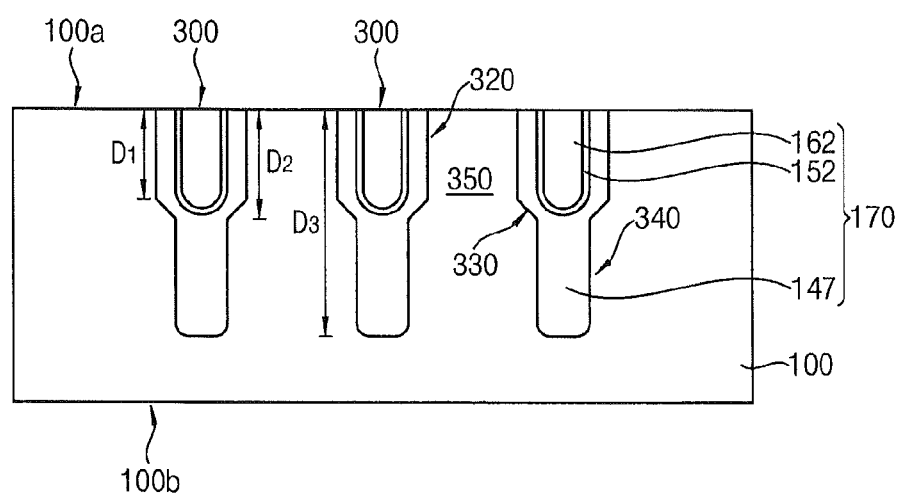
FIG. 20 is a cross-sectional view illustrating a semiconductor device having an isolation structure in accordance with other example embodiments.

FIG. 20 is a cross-sectional view illustrating a semiconductor device having an isolation structure in accordance with other example embodiments. Embodiments of FIG. 20 may correspond to embodiments of FIG. 1, so that a detailed description thereabout may be omitted herein.

Referring to FIG. 20, a semiconductor device according to other example embodiments comprises a semiconductor substrate 100 including first 100a and second 100b opposing semiconductor faces and a plurality of trenches 300 therein. A respective trench 300 includes a first semiconductor trench wall 320 that extends into the semiconductor substrate 100, from the first face 100a to a first depth D1 from the first face 100a. A respective trench 300 further includes a second semiconductor trench wall 340 that extends into the semiconductor substrate 100, from a second depth D2 that is deeper from the first face 100a than the first depth D1, to a third depth D3 that is deeper from the first face 100a than the second depth D2. A respective trench 300 still further includes a third semiconductor trench wall 330 that extends into the semiconductor substrate 100 at a lesser slope than that of the first 320 and second 340 semiconductor trench walls, from the first semiconductor trench wall 320 at the first depth D1 to the second semiconductor trench wall 340 at the second depth D2. A respective trench 300 has a different width from the first face 100a to the first depth D1 compared to from the second depth D2 to the third depth D3. An isolation region 170 is provided in the trench, on the first 320, second 340 and third 330 semiconductor trench walls.

In some example embodiments, the first semiconductor trench wall 320 and the second semiconductor trench wall 340 both extend into the semiconductor substrate 100 orthogonal to the first face 100a, and the third semiconductor trench wall 330 extends into the semiconductor substrate 100 oblique to the first face 100a. In still other example embodiments, a respective trench 300 is wider from the first face 100a to the first depth D1 than from the second depth D2 to the third depth D3, as also illustrated in FIG. 20. As also illustrated in FIG. 20, the plurality of trenches 300 define a plurality of active semiconductor regions 350, a respective one of which extends between adjacent trenches 300. The isolation region 170 may comprise a first insulation layer 147 that lines the first semiconductor trench walls 320 and fills the trenches between the second semiconductor trench walls 340, and a second insulation layer 152, 162, on the first insulation layer 147, that fills the trenches 300 between the first semiconductor trench walls 320. A diode, a first (bottom) electrode, a phase change layer and a second (top) electrode may be provided as was described, for example, in FIG. 1.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   a substrate including an active region having an upper active pattern and a lower active pattern on the upper active pattern, the active region having a first aspect ratio larger than about 13:1 and a second aspect ratio smaller than about 13:1, the first aspect ratio being defined as a ratio of a sum of heights of the upper active pattern and the lower active pattern with respect to a width of the upper active pattern, the second aspect ratio being defined as a ratio of the sum of the heights of the upper active pattern and the lower active pattern with respect to a width of the lower active pattern; and
   an isolation layer structure adjacent to the active region.

2. The semiconductor device of claim 1, wherein both of a ratio of the height of the upper active pattern with respect to the width of the upper active pattern and a ratio of the height of the lower active pattern with respect to the width of the lower active pattern are smaller than about 13:1.

3. The semiconductor device of claim 1, wherein each of the active region and the isolation layer structure extends in a first direction, and both of a plurality of active regions and a plurality of isolation layer structures are provided in a second direction substantially perpendicular to the first direction.

4. The semiconductor device of claim 1, wherein the isolation layer structure fills a first trench at an upper portion of the substrate and a second trench under the first trench.

5. The semiconductor device of claim 4, wherein a width of the first trench is larger than a width of the second trench.

6. The semiconductor device of claim 5, wherein the isolation layer structure includes:
   a first insulation layer pattern on an inner wall of a first trench, the first insulation layer filling the second trench;
   a second insulation layer pattern on the first insulation layer pattern; and
   a third insulation layer pattern on the second insulation layer pattern, the third insulation layer pattern filling a remaining portion of the first trench.

7. The semiconductor device of claim 6, wherein the first insulation layer pattern and the third insulation layer pattern include an oxide and the second insulation layer pattern includes a nitride.

8. The semiconductor device of claim 1, further comprising:
   a diode on the active region;
   a lower electrode on the diode;
   a phase change material layer pattern on the lower electrode; and
   an upper electrode on the phase change material layer pattern.

9. A semiconductor device comprising:
   a semiconductor substrate including first and second opposing semiconductor faces and a plurality of trenches therein;
   a respective trench including a first semiconductor trench wall that extends into the semiconductor substrate, from the first face to a first depth from the first face;
   the respective trench further including a second semiconductor trench wall that extends into the semiconductor substrate, from a second depth that is deeper from the first face than the first depth to a third depth that is deeper from the first face than the second depth; and
   the respective trench still further including a third semiconductor trench wall that extends into the semiconductor substrate at a lesser slope than that of the first and second semiconductor trench walls, from the first semiconductor trench wall at the first depth to the second semiconductor trench wall at the second depth, the respective trench having a different width from the first face to the first depth compared to from the second depth to the third depth; and
   an isolation region in the trench, on the first, second and third semiconductor trench walls, wherein the isolation region comprises:
a first insulation layer that lines the first semiconductor trench walls and fills the trenches between the second semiconductor trench walls; and
a second insulation layer on the first insulation layer that fills the trenches between the first semiconductor trench walls.

10. The semiconductor device of claim 9, wherein the first semiconductor trench wall and the second semiconductor trench wall both extend into the semiconductor substrate orthogonal to the first face and wherein the third semiconductor trench wall extends into the semiconductor substrate oblique to the first face.

11. The semiconductor device of claim 10 wherein the respective trench is wider from the first face to the first depth than from the second depth to the third depth.

12. The semiconductor device of claim 10, wherein the plurality of trenches define a plurality of active semiconductor regions, a respective one of which extends between adjacent trenches.

13. The semiconductor device of claim 12 further comprising:
a diode on a respective semiconductor active region;
a first electrode on a respective diode;
a phase change layer on a respective first electrode; and
a second electrode on a respective phase change layer.

* * * * *